United States Patent
Pan et al.

(10) Patent No.: US 6,817,465 B2
(45) Date of Patent: Nov. 16, 2004

(54) PICKUP MECHANISM FOR MICROWORKPIECE

(75) Inventors: Cheng-Tan Pan, Hsinchu Hsien (TW); Tung-Chuan Wu, Hsinchu Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 228 days.

(21) Appl. No.: 10/014,490

(22) Filed: Dec. 14, 2001

(65) Prior Publication Data

US 2003/0062803 A1 Apr. 3, 2003

(30) Foreign Application Priority Data

Sep. 28, 2001 (TW) ...................................... 90216594 U (51) Int. Cl.[7] .............................................. B65G 47/14
(52) U.S. Cl. ...................................... 198/396; 198/630
(58) Field of Search ................................ 198/391, 396, 198/459.7, 451, 630, 463.6; 221/161, 167

(56) References Cited

U.S. PATENT DOCUMENTS

| | | | | |
|---|---|---|---|---|
| 1,888,851 A | * | 11/1932 | Donovan et al. ............ | 198/396 |
| 2,453,457 A | * | 11/1948 | Platt et al. .................... | 198/630 |
| 3,301,379 A | * | 1/1967 | Moore .......................... | 198/391 |
| 3,656,605 A | * | 4/1972 | Gess ............................. | 198/391 |
| 5,259,723 A | * | 11/1993 | Willis et al. .............. | 198/463.6 |
| 5,810,155 A | * | 9/1998 | Hashimoto et al. ......... | 198/630 |
| 6,218,762 B1 | | 4/2001 | Hill et al. | |
| 6,220,550 B1 | | 4/2001 | McKillip, Jr. | |
| 6,255,758 B1 | | 7/2001 | Cabuz et al. | |
| 6,443,669 B2 | * | 9/2002 | Saito ........................... | 198/396 |
| 6,450,322 B1 | * | 9/2002 | Beck ........................ | 198/463.6 |
| 6,595,350 B1 | * | 7/2003 | Stouffer ....................... | 198/630 |

* cited by examiner

*Primary Examiner*—Joseph Valenza
(74) *Attorney, Agent, or Firm*—Birch, Stewart, Kolasch & Birch, LLP (57) ABSTRACT

A pickup mechanism for handling micro components includes a microworkpiece supplying unit, a microworkpiece orientation unit and a microworkpiece separation unit. The microworkpiece orientation unit connects with the microworkpiece supplying unit and the microworkpiece separation unit. The micro components are supplied by the supplying unit, then orientated by the orientation unit. Those components orientated in a specific direction are led to the separation unit and separated for a following working device to process. Therefore, the pickup mechanism provides a continuous supplying, orientation and separation of the micro components for further assembly or fabrication processes.

25 Claims, 7 Drawing Sheets

PICKUP MECHANISM FOR MICROWORKPIECE

BACKGROUND OF THE INVENTION

1. Field of the Invention

The invention generally relates to a mechanism for picking up tiny workpiece, and more particularly relates to a mechanism for supplying, orientating and separating micro components in advance of further fabrication or assembly process.

2. Related Art

Researchers and engineers started developing integrated circuits by 1960. After developments in these years, minimized electronic products have been widely used in homes and give a revolution to the industry.

Now, engineers are further incorporating conventional machining techniques and semiconductor fabrication methods, and developing micromachine technologies, such as microelectromechanical system (MEMS), lithography electrofoaming micromolding (LIGA) and micromaching. The micromachine technologies minimize the sizes of mechanical devices. They are supposed to further revolutionize the industry just like the semiconductor technologies had.

Before assembling a micromachine, the microworkpieces or micro components have to be individually picked up and handled. The techniques at least include supplying, orientating and separating the components. Though some prior arts, such as that disclosed in U.S. Pat. Nos. 6,218,762; 6,220,550 and 6,255,758, provide means for transferring micro components, they do not provide the techniques required for a continuous process, such as supplying, orientating and separating the micro components.

To assemble a practical micromachine, it requires a pickup mechanism that can first supply the micro components, then arrange the components in order and separate them one by one for further assembly process.

SUMMARY OF THE INVENTION

The invention is therefore to provide a pickup mechanism for microworkpiece through which the workpieces are supplied, orientated and separated in a continuous process for further assembly procedure.

To achieve the aforesaid object, a pickup mechanism according to the present invention includes a microworkpiece supplying unit, a microworkpiece orientation unit and a microworkpiece separation unit. The microworkpiece orientation unit connects with the microworkpiece supplying unit and the microworkpiece separation unit. The micro components are supplied by the supplying unit, then orientated by the orientation unit. Those components orientated in a specific direction are led to the separation unit and separated for a following working device to process. Therefore, the pickup mechanism of the invention provides a continuous supplying, orientation and separation of the micro components for further assembly or fabrication processes.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given hereinbelow. However, this description is for purposes of illustration only, and thus is not limitative of the invention, wherein.

DETAILED DESCRIPTION OF THE INVENTION

Figure 1:
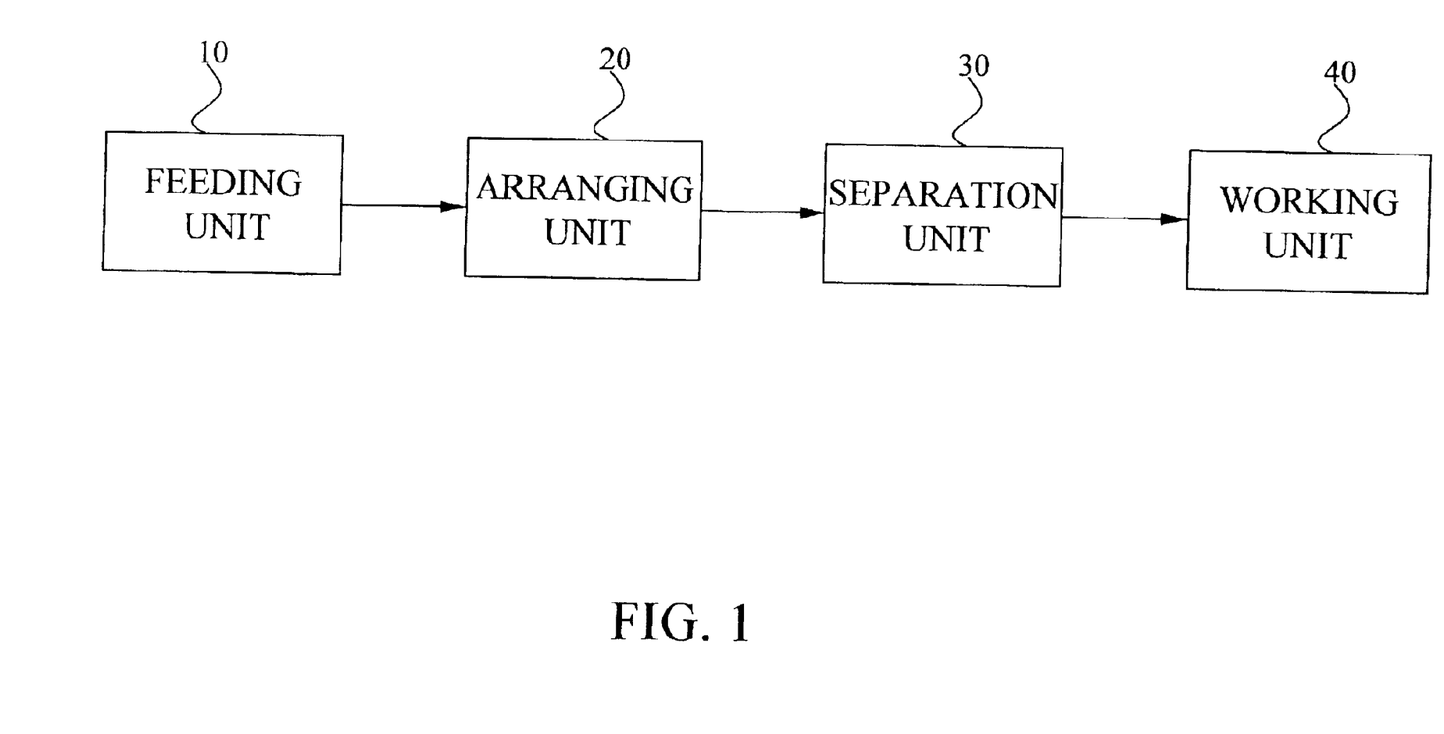
FIG. 1 is a block diagram showing the composition of a pickup mechanism according to the invention.
Figure 2A:
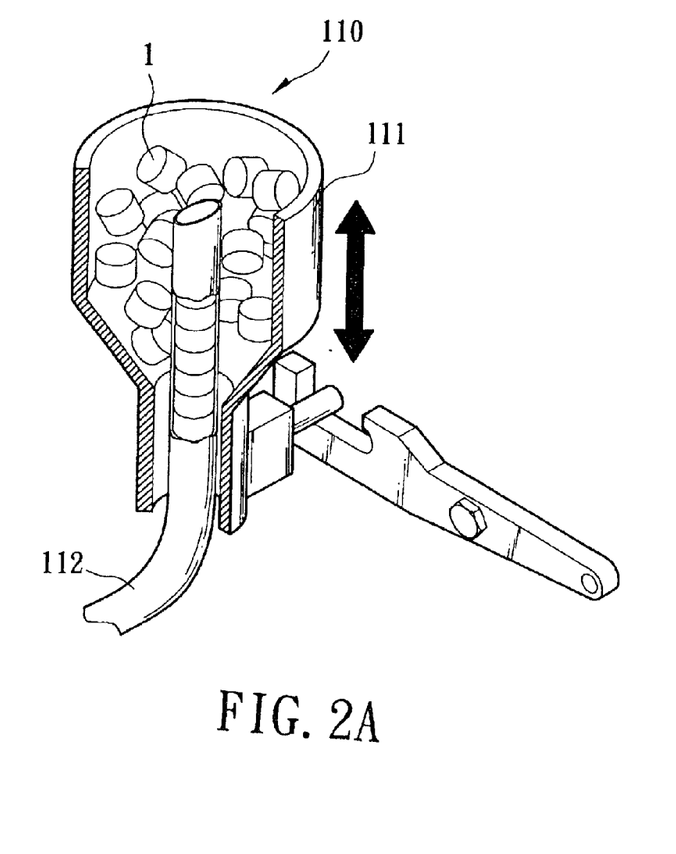
FIGS. 2A to 2D are embodiments of supplying unit applied in the invention.

As shown in FIG. 1, a pickup mechanism according to the present invention includes a microworkpiece supplying unit 10, a microworkpiece orientation unit 20 and a microworkpiece separation unit 30 for supplying, orientating and separating the micro components 1 (as shown in FIG. 2A) for a following working unit 40 to process. The microworkpiece orientation unit 20 connects with the microworkpiece supplying unit 10 and the microworkpiece separation unit 30. The micro components 1 are supplied by the supplying unit 10, then orientated by the orientation unit 20. Those components orientated in a specific direction are led to the separation unit 30 and separated for the following working device 40 to process.

The microworkpiece supplying unit 10 is used to supply the micro components 1 to the microworkpiece orientation unit 20. Several kinds of devices can be applied. For example, the situation of supplying units 10 having at least one reciprocating microactuator, swinging microactuator, piezoelectric microactuator or pneumatic actuator will be described below.

As shown in FIG. 2A, a reciprocating microactuator 110 includes a supplying element 111 and an accumulator 112. The supplying element 111 supplies micro components 1 to the accumulator 112. The accumulator 112 receives the micro components 1 when the supplying element 111 moves up and down relatively to the accumulator 112.

Figure 2B:
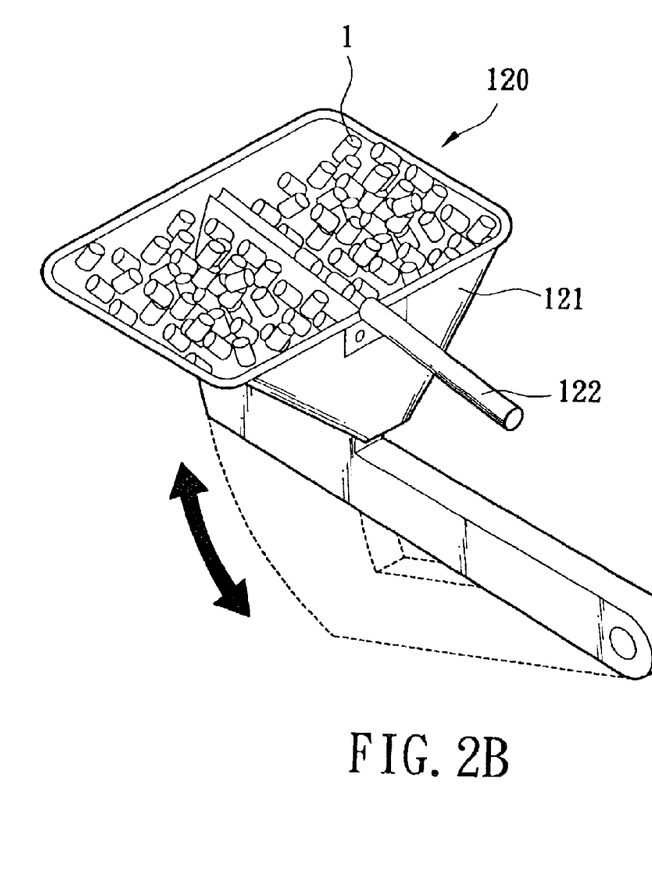

As shown in FIG. 2B, a swinging microactuator 120 includes a supplying element 121 and an accumulator 122. The supplying element 121 supplies micro components I to the accumulator 122. The accumulator 122 receives the micro components 1 when the supplying element 121 swings relatively to the accumulator 122.

Figure 2C:
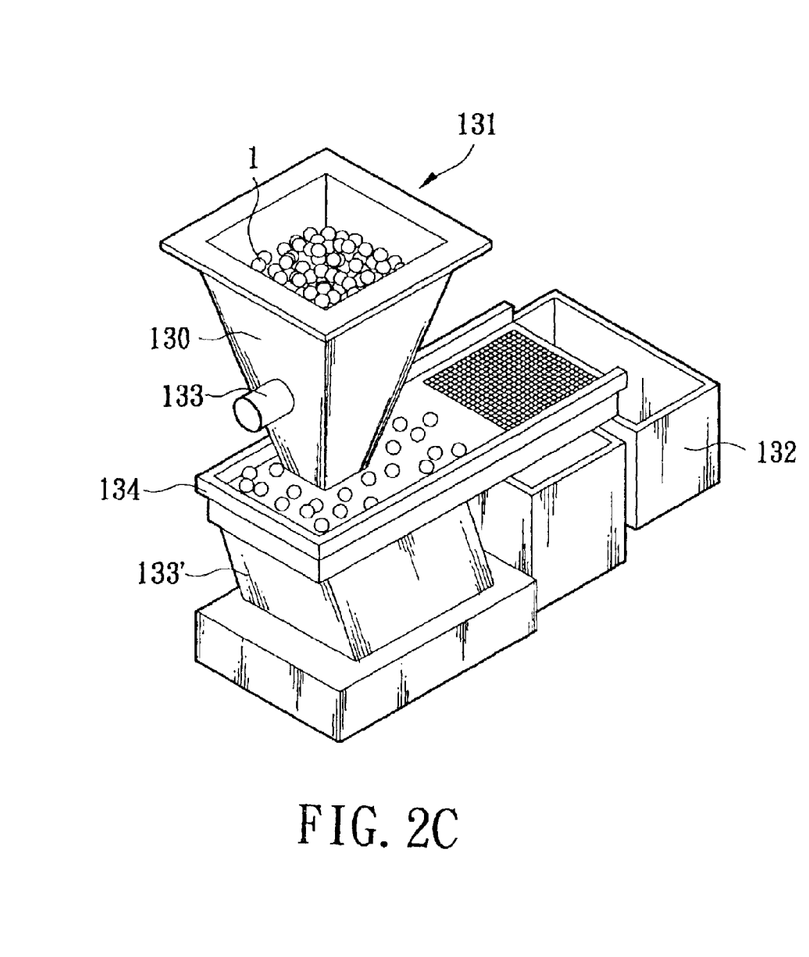

As shown in FIG. 2C, a piezoelectric microactuator 130 includes a supplying element 131 for supplying the micro component 1; a plane 134 for receiving the micro components 1 from the supplying element 131; vibrators 133, 133' connected respectively to the supplying element 131 and the plane 134 for shaking the two; and an accumulator 132 for receiving the micro components 1 from the plane 134. The supplying element 131 supplies the micro components 1 to the plane 134 and further moves them to the accumulator 132 by vibration of the vibrators 133 and 133'.

Figure 2D:
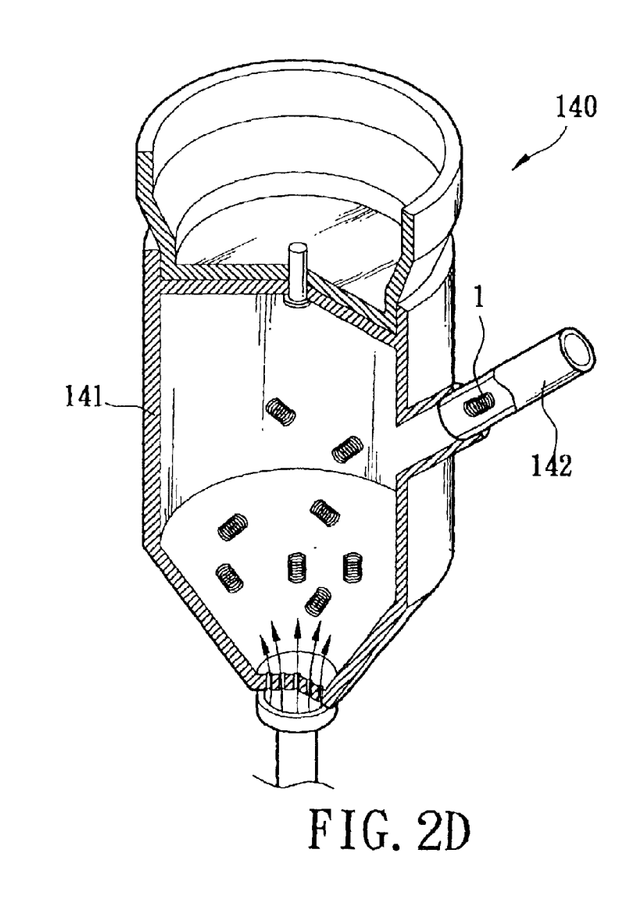

As shown in FIG. 2D, a pneumatic microactuator 140 includes a supplying element 141 and an accumulator 142.

The supplying element 141 supplies micro components 1 to the accumulator 142. The accumulator 142 sucks the micro components 1 in when airflow coming from bottom of the supplying element 141 blows up the micro components 1.

The microworkpiece orientation unit 20 is connected to the microworkpiece supplying unit 10 and used to arrange the micro components 1 into specific direction for the microworkpiece separation unit 30 to operate. Several embodiments of microworkpiece orientation unit 20 will be described below.

As shown in FIGS. 3A, 4A, 4B and 4C, a microworkpiece orientation unit 20 includes some stoppers 21, 22 for selecting micro components 1 of specific direction, and a transferrer 23 for moving the micro components 1. The stoppers 21, 22 are used to expel those micro components 1 that are not in the desired direction. The transferrer 23 includes a serial of microactuators 231 and a transport belt 232 for transferring the micro components 1 to the microworkpiece separation unit 30. The serial of microactuators 231 located under the transport belt 232 reciprocate orderly so as to make the transport belt 232 move in a wave motion and push the micro components 1 along the transport belt 232.

Figure 5A:
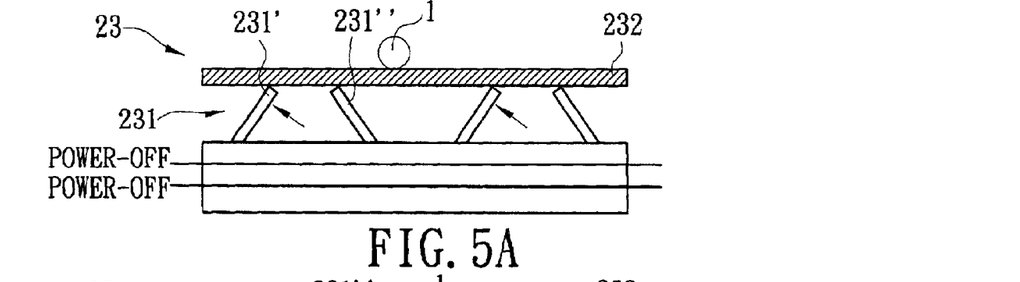
FIGS. 5A to 5E are functional views of another transferrer of an orientation unit applied in the invention.
Figure 5B:
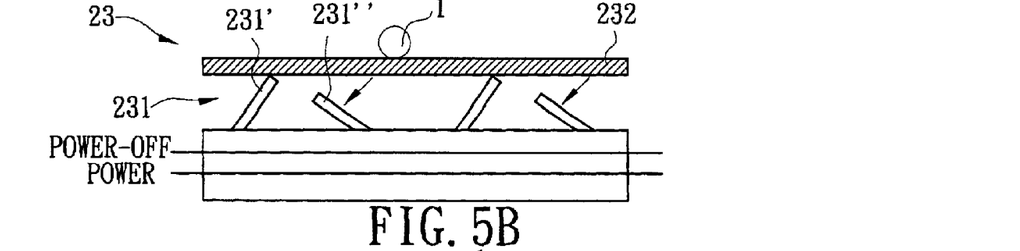
Figure 5C:
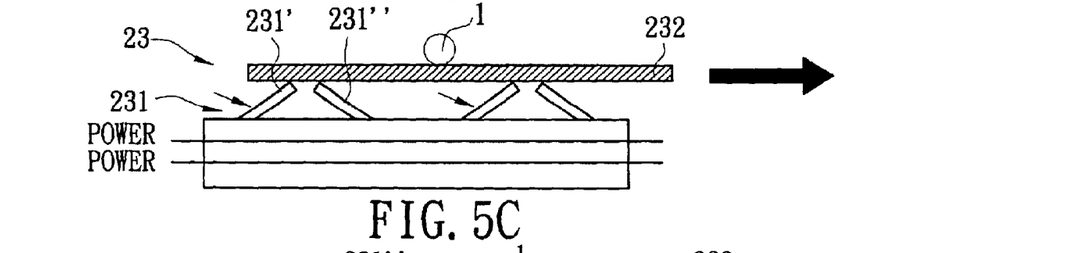
Figure 5D:
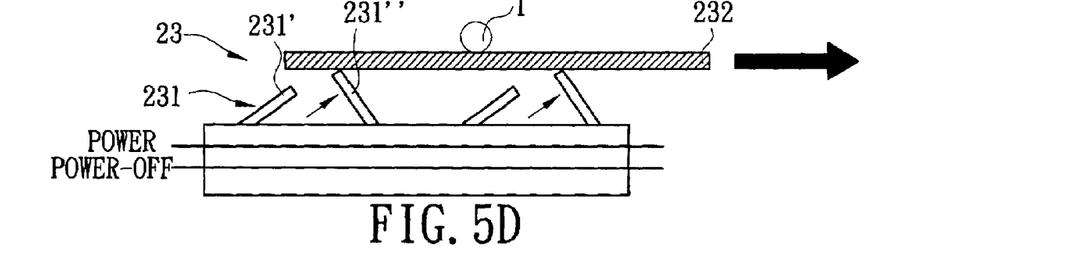
Figure 5E:
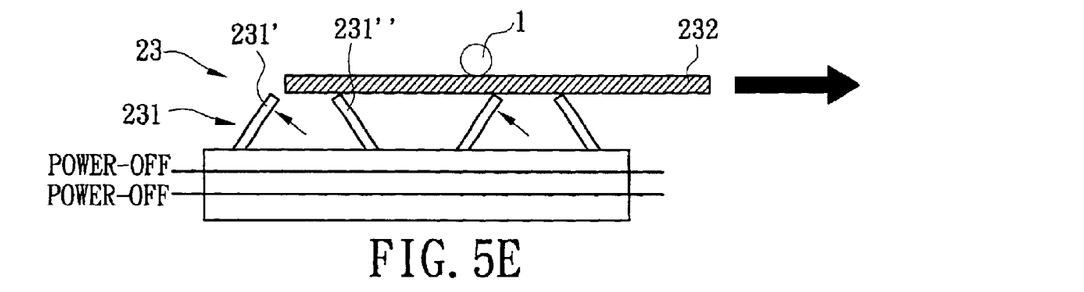

Another embodiment of transferrer 23 is illustrated in FIGS. 5A to 5E. The transferrer 23 includes pairs of microactuators 231, 231' and a micro transport belt 232. Each microactuator 231 or 231' will swing to a specific direction upon being electrically powered, and release to another direction upon power-off. Therefore, the first microactuators 231 first release upwards, as shown in FIG. 5A, then the second microactuators 231' are powered to swing downwards, as shown in FIG. 5B. Further, the first microactuators 231 are powered to swing downwards, as shown in FIG. 5C, and the second microactuators 231' release upwards, as shown in FIG. 5D. Again, the first microactuators 231 release upwards, as shown in FIG. 5E, and so the microactuators 231 and 231' repeat. The movement of the microactuators 231, 231' make the micro transport belt 232 moves so that the micro components 1 will move along with the micro transport belt 232. Other methods for actuating the transferrer 23, such as motor-powered transport belt, can also be applied.

Figure 3A:
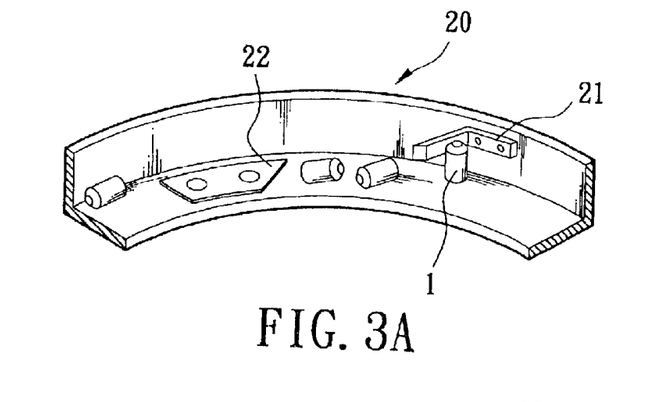
FIGS. 3A to 3D are embodiments of orientation unit applied in the invention.
Figure 3B:
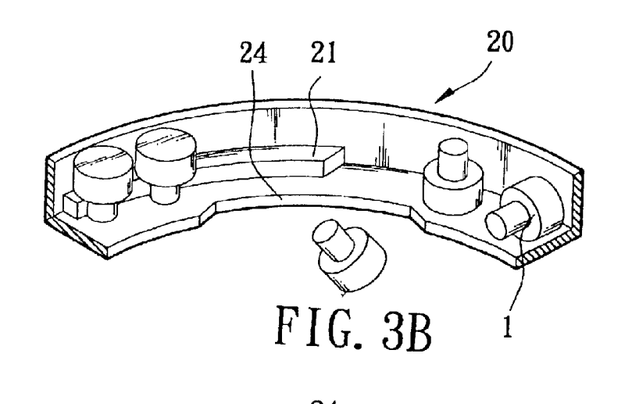
Figure 3C:
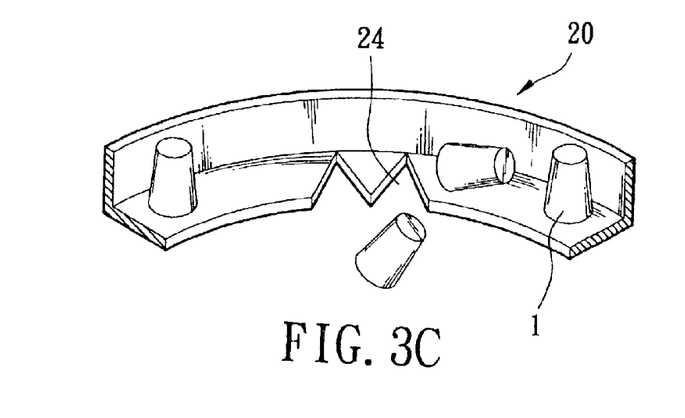
Figure 3D:
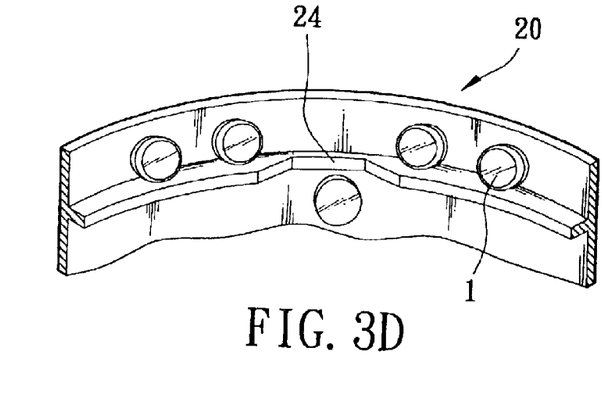
Figure 4A:
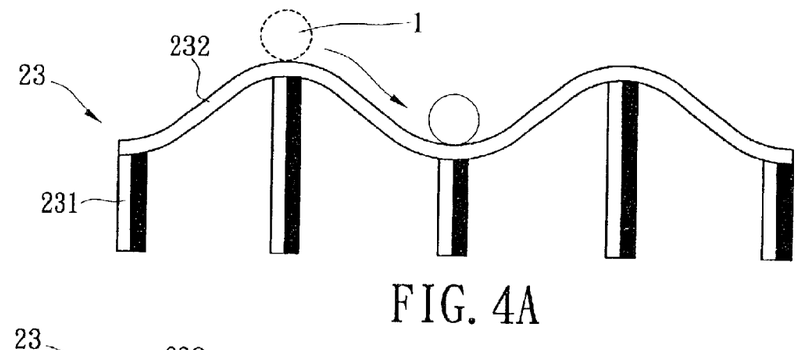
FIGS. 4A to 4C are functional views of a transferrer of an orientation unit applied in the invention.
Figure 4B:
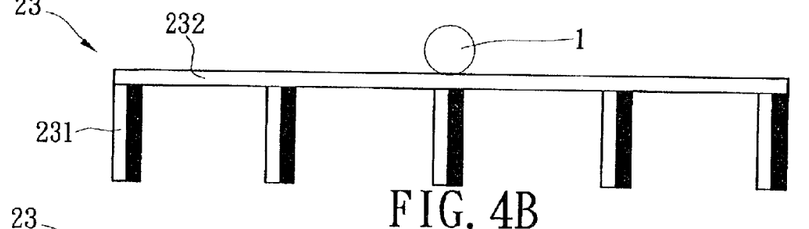
Figure 4C:
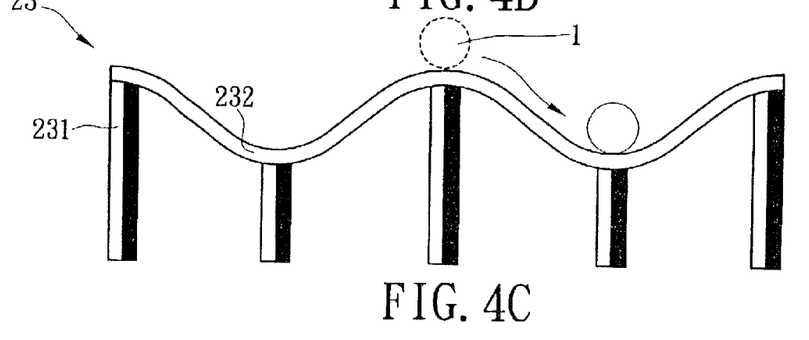

When the micro transport belt 232 transfers the orientated micro components 1 to the separation unit 30, the stopper 21, 22 of the microworkpiece orientation unit 20 expel those micro components 1 that are not in the correct direction and only pass the micro components 1 of the correct direction. As shown in FIGS. 3B, 3C, 3D, the stoppers 21, 22 of FIG. 3A are replaced by a stopper 21 and a cutoff 24 or just by cutoffs 24 for expelling the micro components 1 of wrong direction.

The microworkpiece separation unit 30 is connected to the microworkpiece orientation unit 20 and used to separate the micro components 1 into specific path for being assembled or fabricated. Several embodiments of microworkpiece separation unit 30 will be described below.

Figure 6A:
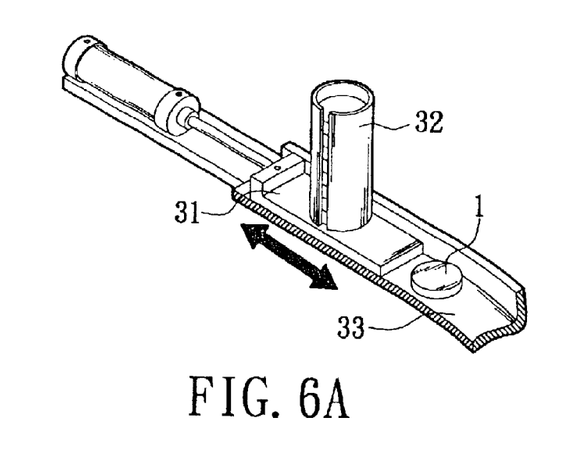
FIGS. 6A to 6D are embodiments of separation unit applied in the invention.

As shown in FIG. 6A, a microworkpiece separation unit 30 includes a separator 31, a reservoir 32 and a transferrer 33. The reservoir 32 stores the orientated micro components 1 provided by the microworkpiece orientation unit 20. The transferrer 33 transports the micro components 1 that have been separated. The separator 31 will separate the micro components 1 one by one (or several ones a time) from the reservoir 32 to the transferrer 33. As shown in the drawing, when the separator 31 moves toward the reservoir 32, a micro component 1 is pushed into the transferrer 33, and will be moved to an unshown working device 40 for a following process.

Figure 6B:
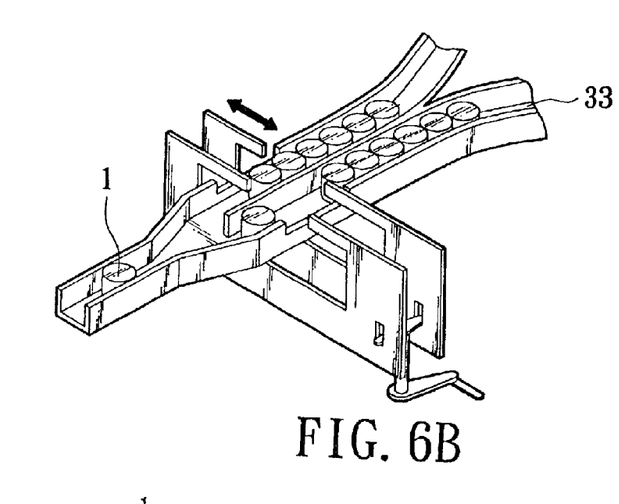

As shown in FIG. 6B, a microworkpiece separation unit 30 includes a separator 31 for separating two rows of micro components 1 coming from two transferrers 33. The separator 31 includes two slide shutters that interchangeably reciprocate to separate the micro components 1 one by one from the transferrers 33. The micro components 1 will then move to an unshown working device 40 for a following process.

Figure 6C:
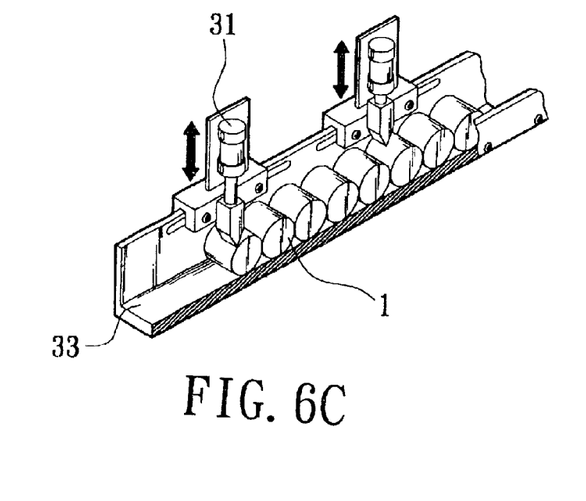

As shown in FIG. 6C, a microworkpiece separation unit 30 includes a separator 31 for separating micro components 1 coming along a transferrer 33. The separator 31 includes two plungers that are interchangeably activated to separate several micro components 1 (e.g., five ones as shown) each time from the transferrer 33.

Figure 6D:
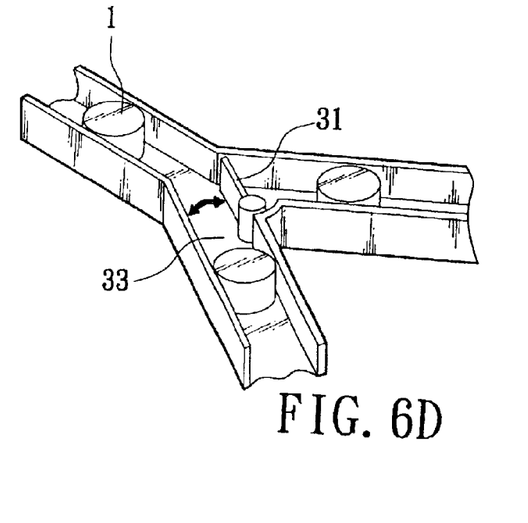

As shown in FIG. 6D, a microworkpiece separation unit 30 includes a separator 31 for separating micro components 1 coming along a transferrer 33 and dividing them into two paths. The separator 31 includes a movable shutter that selectively opens one path at a time for a micro component 1 passing through so as to control the allocation of micro component 1.

The aforesaid components are tiny components for handling micro components 1 of micromachine. Therefore, they are made through micromachine technologies, such as microelectromechanical system (MEMS), lithography electrofoaming micromoloding (LIGA) and some integrated circuit fabrication methods.

In conclusion, the invention provides a microworkpiece pickup mechanism for continuously supplying, orientating and separating micro components 1 so that the separated components oriented in a specific direction can be processed by a following working device for further assembly or fabrication.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A pickup mechanism for handling micro components, comprising:

a microworkpiece supplying unit for supplying micro components;

a microworkpiece orientation unit, connected with said microworkpiece supplying unit, for orientating said micro components in a specific direction, and transporting said oriented micro components; and a microworkpiece separation unit, connected with said microworkpiece orientation unit, for separating said micro components and providing for a working device to process;

wherein said microworkpiece orientation unit comprises a transferrer for moving said micro components to said microworkpiece separation unit and a stopper for selecting said micro components of specific direction; and wherein said transferrer comprises a serial of microactuators and a transport belt for transferring said micro components to said microworkpiece separation unit; said serial of microactuators located under said transport belt reciprocate orderly so as to make said transport belt move in a wave motion and push said micro components along said transport belt.

2. A pickup mechanism for handling micro components according to claim 1 wherein said microworkpiece supplying unit comprises at least a reciprocating microactuator.

3. A pickup mechanism for handling micro components according to claim 2 wherein said microworkpiece supplying unit comprises a supplying element for supplying said micro components, and an accumulator for receiving said micro components when said supplying element moves back and forth relatively to said accumulator.

4. A pickup mechanism for handling micro components according to claim 1 wherein said microworkpiece supplying unit comprises at least a swinging microactuator.

5. A pickup mechanism for handling micro components according to claim 4 wherein said microworkpiece supplying unit comprises a supplying element for supplying said micro components; and an accumulator for receiving said micro components when said supplying element swings relatively to said accumulator.

6. A pickup mechanism for handling micro components according to claim 1 wherein said microworkpiece supplying unit comprises at least a piezoelectric microactuator.

7. A pickup mechanism for handling micro components according to claim 6 wherein said microworkpiece supplying unit comprises a supplying element for supplying said micro component; a plane for receiving said micro components from said supplying element; two vibrators connected respectively to said supplying element and said plane for shaking the two; and an accumulator for receiving said micro components from said plane; said supplying element supplies and moves said micro components via said plane to the said accumulator by vibration of said vibrators.

8. A pickup mechanism for handling micro components according to claim 1 wherein said microworkpiece supplying unit comprises at least a pneumatic actuator.

9. A pickup mechanism for handling micro components according to claim 8 wherein said microworkpiece supplying unit comprises a supplying element for supplying said micro components, and an accumulator for sucking said micro components in when an airflow coming from bottom of said supplying element blows up said micro components.

10. A pickup mechanism for handling micro components according to claim 1 wherein said microworkpiece separation unit comprises a separator, a reservoir and a transferrer; said reservoir stores orientated micro components provided by said microworkpiece orientation unit; said separator separates said micro components from said reservoir; and said transferrer transports said micro components that have been separated.

11. A pickup mechanism for handling micro components according to claim 1 wherein said microworkpiece separation unit comprises a transferrer for transporting orientated micro components provided by said microworkpiece orientation unit; and a separator for separating said micro components transported by said transferrer.

12. A pickup mechanism for handling micro components according to claim 11 wherein said microworkpiece separation unit comprises another transferrer, and another separator for separating two rows of micro components coming from two transferrers; said another separator includes two slide shutters that interchangeably reciprocate to separate said micro components one by one from the transferrers.

13. A pickup mechanism for handling micro components according to claim 11 wherein said microworkpiece separation unit comprisesa another separator for separating micro components coming along the transferrer; said separator includes two plungers that are interchangeably activated to separate at least a micro component each time from said transferrer.

14. A pickup mechanism for handling micro components according to claim 11 wherein said microworkpiece separation unit comprises a separator for separating micro components coming along a transferrer and dividing said micro components into two paths; said separator includes a movable shutter that selectively opens one path at a time for a micro component passing through so as to control the allocation of said micro component.

15. A pickup mechanism for handling micro components, comprising:
a microworkpiece supplying unit for supplying micro components;
a microworkpiece orientation unit, connected with said microworkpiece supplying unit, for orientating said micro components in a specific direction, and transporting said oriented micro components; and
a microworkpiece separation unit, connected with said microworkpiece orientation unit, for separating said micro components and providing for a working device to process;
wherein said microworkpiece separation unit comprises a transferrer for transporting orientated micro components provided by said microworkpiece orientation unit; and a separator for separating said micro components transported by said transferrer; and
wherein said microworkpiece separation unit comprises another transferrer, and another separator for separating two rows of micro components coming from two transferrers; said another separator includes two slide shutters that interchangeably reciprocate to separate said micro components one by one from the transferrers.

16. A pickup mechanism for handling micro components according to claim 15 wherein said microworkpiece orientation unit comprises a transferrer for moving said micro components to said microworkpiece separation unit and a stopper for selecting said micro components of specific direction.

17. A pickup mechanism for handling micro components according to claim 16 wherein said transferrer comprises pairs of microactuators and a micro transport belt; each microactuator swings to a specific direction upon being electrically powered, and releases to another direction upon power-off so that one of said pair of microactuators first release upwards, then the other of said pair of microactuators are powered to swing downwards; further, said one of said pair of microactuators are powered to swing downwards, and said the other of said pair of microactuators release upwards, and thus repeat to make said micro transport belt carrying said micro components moves.

18. A pickup mechanism for handling micro components according to claim 15 wherein said microworkpiece supplying unit comprises at least a reciprocating microactuator.

19. A pickup mechanism for handling micro components according to claim 18 wherein said microworkpiece supplying unit comprises a supplying element for supplying said micro components, and an accumulator for receiving said micro components when said supplying element moves back and forth relatively to said accumulator.

20. A pickup mechanism for handling micro components according to claim 15 wherein said microworkpiece supplying unit comprises at least a swinging microactuator.

21. A pickup mechanism for handling micro components according to claim 20 wherein said microworkpiece supplying unit comprises a supplying element for supplying said micro components; and an accumulator for receiving said micro components when said supplying element swings relatively to said accumulator.

22. A pickup mechanism for handling micro components according to claim 15 wherein said microworkpiece supplying unit comprises at least a piezoelectric microactuator.

23. A pickup mechanism for handling micro components according to claim 22 wherein said microworkpiece supplying unit comprises a supplying element for supplying said micro component; a plane for receiving said micro components from said supplying element; two vibrators connected respectively to said supplying element and said plane for shaking the two; and an accumulator for receiving said micro components from said plane; said supplying element supplies and moves said micro components via said plane to the said accumulator by vibration of said vibrators.

24. A pickup mechanism for handling micro components according to claim 15 wherein said microworkpiece supplying unit comprises at least a pneumatic actuator.

25. A pickup mechanism for handling micro components according to claim 24 wherein said microworkpiece supplying unit comprises a supplying element for supplying said micro components, and an accumulator for sucking said micro components in when an airflow coming from bottom of said supplying element blows up said micro components.

* * * * *